United States Patent
Chien et al.

(10) Patent No.: US 9,171,641 B2
(45) Date of Patent: Oct. 27, 2015

(54) SHIFT REGISTER CIRCUIT AND DRIVING METHOD THEREOF

(71) Applicant: AU Optronics Corp., Hsin-Chu (TW)

(72) Inventors: Ling-Ying Chien, Hsin-Chu (TW);
Kuang-Hsiang Liu, Hsin-Chu (TW);
Chen-Ming Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 230 days.

(21) Appl. No.: 14/078,538

(22) Filed: Nov. 13, 2013

(65) Prior Publication Data

US 2014/0355731 A1 Dec. 4, 2014

(30) Foreign Application Priority Data

May 28, 2013 (TW) .............................. 102118809 U

(51) Int. Cl.
*G11C 19/00* (2006.01)
*G11C 19/28* (2006.01)

(52) U.S. Cl.
CPC ........ *G11C 19/28* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 8,054,935 B2 * | 11/2011 | Tsai | | 377/64 |
| 8,102,962 B2 * | 1/2012 | Liu et al. | | 377/64 |
| 8,155,261 B2 * | 4/2012 | Hu | | 377/64 |
| 8,582,715 B2 * | 11/2013 | Chung et al. | | 377/74 |
| 8,983,020 B2 * | 3/2015 | Chien et al. | | 377/64 |
| 9,019,191 B2 * | 4/2015 | Woo et al. | | 345/100 |
| 2005/0220262 A1 | 10/2005 | Moon | | |
| 2008/0062071 A1 * | 3/2008 | Jeong | | 345/46 |
| 2012/0163528 A1 * | 6/2012 | Jang et al. | | 377/64 |
| 2012/0182050 A1 * | 7/2012 | Yang et al. | | 327/109 |
| 2014/0093028 A1 * | 4/2014 | Wu | | 377/64 |
| 2015/0028933 A1 * | 1/2015 | Chen | | 327/382 |
| 2015/0123886 A1 * | 5/2015 | Chen | | 345/92 |

* cited by examiner

*Primary Examiner* — Tuan T Lam
(74) *Attorney, Agent, or Firm* — Winston Hsu; Scott Margo

(57) ABSTRACT

An $N_{th}$ shift register unit includes an input circuit, a voltage regulator, and an output circuit. The input circuit is disposed to control a voltage at a control node of the $N_{th}$ shift register unit according to a first scan signal of an $(N-K)_{th}$ shift register unit or a second scan signal of an $(N+K)_{th}$ shift register unit. The voltage regulator includes a first coupling element coupled to a first clock, a first switch disposed to receive the voltage at the control node and generate a reverse bias for reducing current leakage, and a switch control unit disposed to control the first switch according to the first clock. The output circuit is disposed to output a third scan signal.

20 Claims, 5 Drawing Sheets

SHIFT REGISTER CIRCUIT AND DRIVING METHOD THEREOF

BACKGROUND OF THE INVENTION

1. Field of the Invention

The present invention is related to a shift register circuit, and more particularly, an operating method and a voltage regulator of a shift register circuit.

2. Description of the Prior Art

Shift register circuit is widely adopted by present electronic products. However, the decrd efficiency and incrd power loss may occur on existing shift register circuits due to leakage current of transistors forming the circuit. The leakage current may also cause multiple pulses in the shift register circuit which will lead to the inaccuracy of the timing sequence in the shift register circuit. If a shift register circuit with an inaccurate timing sequence is applied to a liquid crystal display, horizontal lines will appear on the LCD and consequently cause a major decline in the display quality. With this in mind, the improvement of the leakage current within a shift register circuit is an issue for an LCD display quality.

SUMMARY OF THE INVENTION

An embodiment of the present invention discloses a shift register circuit. The shift register circuit comprises a plurality of shift register units. An $N_{th}$ shift register unit of the shift register circuit comprises an input circuit, a voltage regulator and an output circuit. The input circuit is configured to control a voltage at a control node of the $N_{th}$ shift register unit according to a first scan signal of an $(N-K)_{th}$ shift register unit of the shift register circuit or a second scan signal of an $(N+K)_{th}$ shift register unit of the shift register circuit wherein N and K are positive integers, and N≥K. The voltage regulator comprises a first coupling element, a first switch and a switch control unit. The first coupling element comprises a first terminal and a second terminal, the first terminal being configured to receive a first clock signal. The first switch comprises a first terminal electrically coupled to the second terminal of the first coupling element, a control terminal electrically coupled to the input circuit and configured to receive the voltage at the control node of the $N_{th}$ shift register unit, and a second terminal. The switch control unit is electrically coupled to the second terminal of the first switch and a ground terminal and configured to control a voltage at the second terminal of the first switch according to the first clock signal and to generate a periodical reverse bias between the control terminal of the first switch and the second terminal of the first switch. The output circuit comprises a first terminal configured to receive the first clock signal, a control terminal electrically coupled to the input circuit to receive the voltage at the control node of the $N_{th}$ shift register unit, and a second terminal configured to output a third scan signal of the $N_{th}$ shift register unit.

These and other objectives of the present invention will no doubt become obvious to those of ordinary skill in the art after reading the following detailed description of the preferred embodiment that is illustrated in the various figures and drawings.

DETAILED DESCRIPTION

The detailed descriptions of the present invention are exemplified below with figures and embodiments. However, the provided embodiments are merely used to illustrate the present invention, not to limit the present invention.

Figure 1:
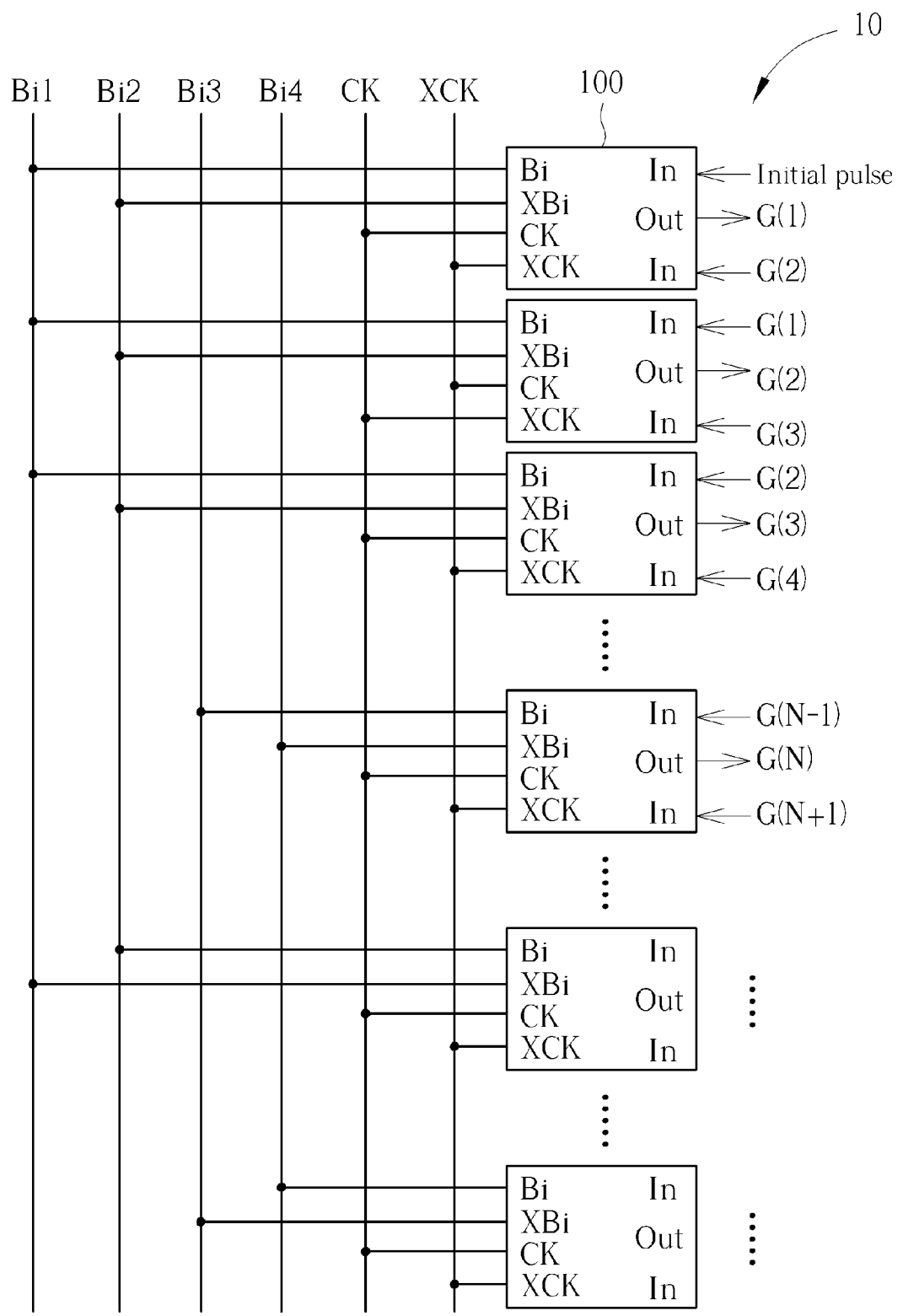
FIG. 1 shows a shift register circuit according to a first embodiment of the present invention.
Figure 2:
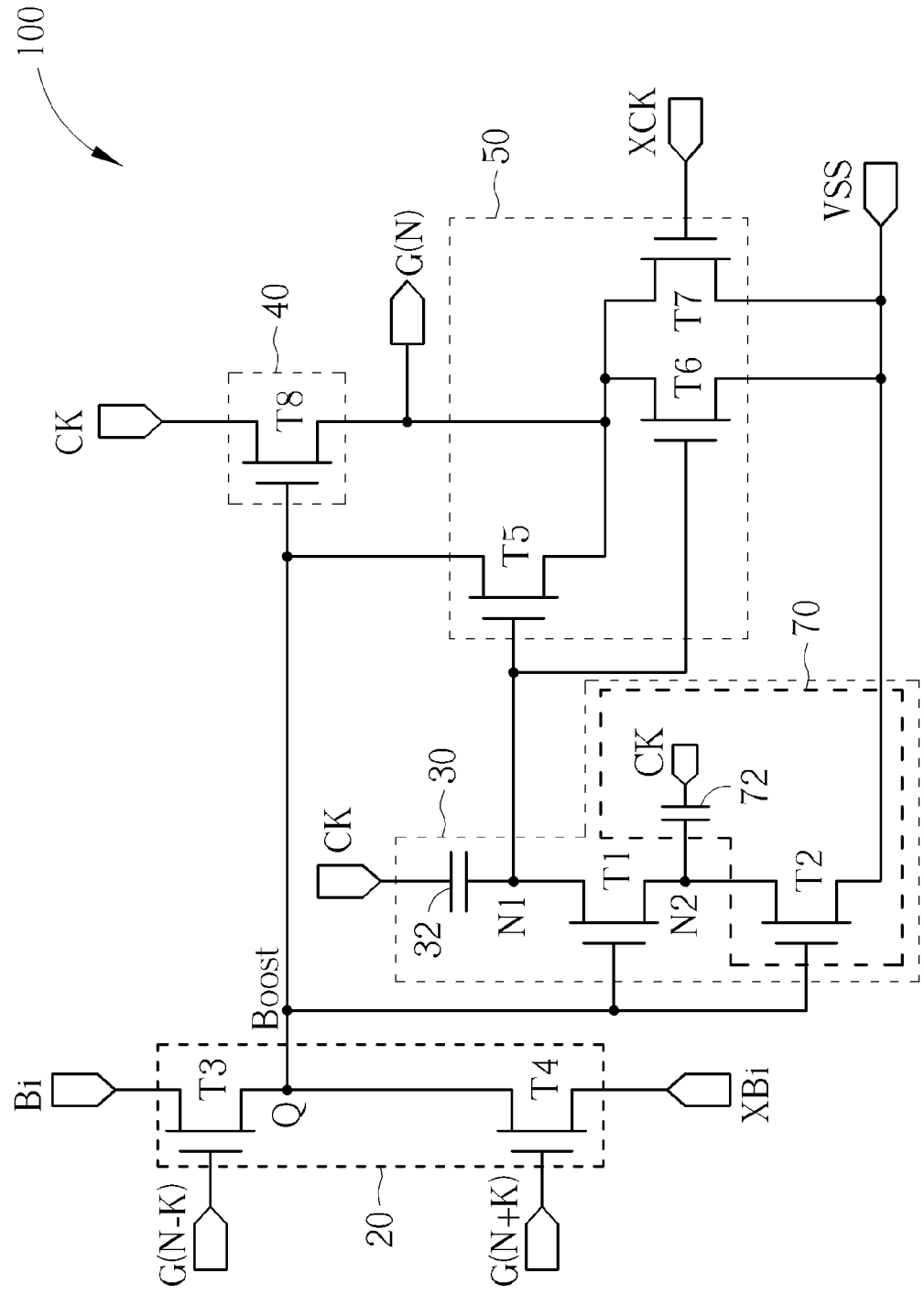
FIG. 2 shows an $N_{th}$ shift register unit of the shift register circuit in FIG. 1.

Pl refer to FIG. 1 and FIG. 2. FIG. 1 shows a shift register circuit 10 according to a first embodiment of the present invention. FIG. 2 shows an $N_{th}$ shift register unit 100 of the shift register circuit 10 in FIG. 1. The shift register circuit 10 comprises a plurality of shift register units 100, and the $N_{th}$ shift register unit 100 is the $N_{th}$ shift register unit 100 of the shift register circuit 10 of the present invention. N is a positive integer.

As shown in FIG. 2, the shift register unit 100 comprises an input circuit 20, a voltage regulator 30 and an output circuit 40. Besides, the shift register unit 100 further comprises a disable circuit 50. The input circuit 20 is configured to control a voltage BOOST at a control node Q of the $N_{th}$ shift register unit 100 according to a first scan signal G(N−K) of an (N−K) $_{th}$ shift register unit of the shift register circuit 10 or a second scan signal G(N+K) of an $(N+K)_{th}$ shift register unit of the shift register circuit 10 wherein N and K are positive integers, and N≥K. The $(N-K)_{th}$ shift register unit of the shift register circuit 10 refers to the $K_{th}$ shift register unit before the $N_{th}$ shift register unit 100, and the $(N+K)_{th}$ shift register unit of the shift register circuit 10 refers to the $K_{th}$ shift register unit after the $N_{th}$ shift register unit 100.

The voltage regulator 30 comprises a first coupling element 32, a first switch T1 and a switch control unit 70. The first coupling element 32 (for example a capacitor) comprises a first terminal configured to receive a first clock signal CK and a second terminal N1. The first switch T1 comprises a first terminal electrically coupled to the second terminal N1 of the first coupling element 32, a control terminal electrically coupled to the input circuit 20 and configured to receive the voltage BOOST at the control node Q of the $N_{th}$ shift register unit 100, and a second terminal N2. The switch control unit 70 is configured to control a voltage at the second terminal N2 of the first switch T1 according to the first clock signal CK and to generate a periodical reverse bias between the control terminal of the first switch T1 and the second terminal N2 of the first switch T1 by making the voltage level of the second terminal N2 of the first switch T1 higher than the voltage level of the control terminal of the first switch T1.

The output circuit 40 comprises a first terminal configured to receive the first clock signal CK, a control terminal electrically coupled to the input circuit 20 to receive the voltage BOOST at the control node Q of the $N_{th}$ shift register unit 100, and a second terminal configured to output a third scan signal G(N) of the $N_{th}$ shift register unit 100. The disable circuit 50 is electrically coupled to the input circuit 20 and the second terminal N1 of the first coupling element 32 and configured to receive a second clock signal XCK and to control the voltage BOOST at the control node Q of the $N_{th}$ shift register unit 100 and a voltage of the third scan signal G(N) according to a voltage at the second terminal N1 of the first coupling element 32 and the second clock signal XCK.

According to a first embodiment of the present invention, the switch control unit 70 comprises a second switch T2 and a second coupling element 72. The second switch T2 comprises a first terminal electrically coupled to the second terminal N2 of the first switch T1, a control terminal electrically coupled to the input circuit 20 and configured to receive the voltage BOOST at the control node Q of the $N_{th}$ shift register unit 100, and a second terminal electrically coupled to a ground terminal VSS. The second coupling element 72 such as a capacitor comprises a first terminal electrically coupled to the second terminal N2 of the first switch T1 and a second terminal configured to receive the first clock signal CK.

According to the first embodiment of the present invention, the input circuit 20 is configured to receive a first logic signal Bi, a second logic signal XBi, the first scan signal G(N−K) and the second scan signal G(N+K), and determine which of the first logic signal Bi and the second logic signal XBi is to be used to control the voltage BOOST at the control node Q of the $N_{th}$ shift register unit 100 according to the first scan signal G(N−K) and the second scan signal G(N+K).

According to the first embodiment of the present invention, the input circuit 20 comprises a third switch T3 and a fourth switch T4. The third switch T3 comprises a first terminal configured to receive the first logic signal Bi, a control terminal configured to receive the first scan signal G(N−K) and a second terminal electrically coupled to the control terminal of the first switch T1 and the control terminal of the second switch T2. The fourth switch T4 comprises a first terminal electrically coupled to the second terminal of the third switch T3, a control terminal configured to receive the second scan signal G(N+K), and a second terminal configured to receive the second logic signal XBi. According to the first embodiment, the mentioned configuration allows the shift register circuit 10 to support bi-directional transmission accordingly. That means pulses of scan signals can be selected to perform scanning from top to bottom or from bottom to top in the shift register circuit 10. However, the mentioned bi-directional transmission is merely an option of the first embodiment of the present invention, but to limit the scope of the first embodiment to bi-directional transmission.

According to the first embodiment of the present invention, the output circuit 40 comprises an eighth switch T8. The eighth switch T8 comprises a first terminal configured to receive the first clock signal CK, a control terminal electrically coupled to the input circuit 20 and configured to receive the voltage BOOST at the control node Q of the $N_{th}$ shift register unit 100, and a second terminal configured to output the third scan signal G(N) of the $N_{th}$ shift register unit 100.

According to the first embodiment of the present invention, the disable circuit 50 comprises a fifth switch T5, a sixth switch T6 and a seventh switch T7. The fifth switch T5 comprises a first terminal electrically coupled to the control node Q of the $N_{th}$ shift register unit 100, a control terminal electrically coupled to the second terminal N1 of the first coupling element 32, and a second terminal electrically coupled to the second terminal of the eighth switch T8 of the output circuit 40. The sixth switch T6 comprises a first terminal electrically coupled to the second terminal of the fifth switch T5, a control terminal electrically coupled to the second terminal N1 of the first coupling element 32, and a second terminal electrically coupled to the ground terminal VSS. The seventh switch T7 comprises a first terminal electrically coupled to the second terminal of the fifth switch T5, a control terminal configured to receive the second clock signal XCK, and a second terminal electrically coupled to the ground terminal VSS. The difference between the phases of the first clock signal CK and the second clock signal XCK can be 180 degrees.

The above-mentioned first switch T1 to the eighth switch T8 can be implemented with NMOS (N-type metal-oxide-semiconductor field-effect transistor) or PMOS (P-type metal-oxide-semiconductor field-effect transistor), and the first coupling element 32 and the second coupling element 72 can be implemented with passive components such as capacitors or resistors. However the types or materials of the first switch T1 to the eighth switch T8, the first coupling element 32 and the second coupling element 72 are not limited to the disclosure of the embodiment.

It is noted that although the components of the input circuit 20, the voltage regulator 30, the output circuit 40 and the disable circuit 50 are shown in FIG. 2, the components of the input circuit 20, the voltage regulator 30, the output circuit 40 and the disable circuit 50 are not limited to the configuration in FIG. 2. Hence, modifications and alterations of the input circuit 20, the voltage regulator 30, the output circuit 40 and the disable circuit 50 may be made while retaining the teachings of the invention.

Figure 3:
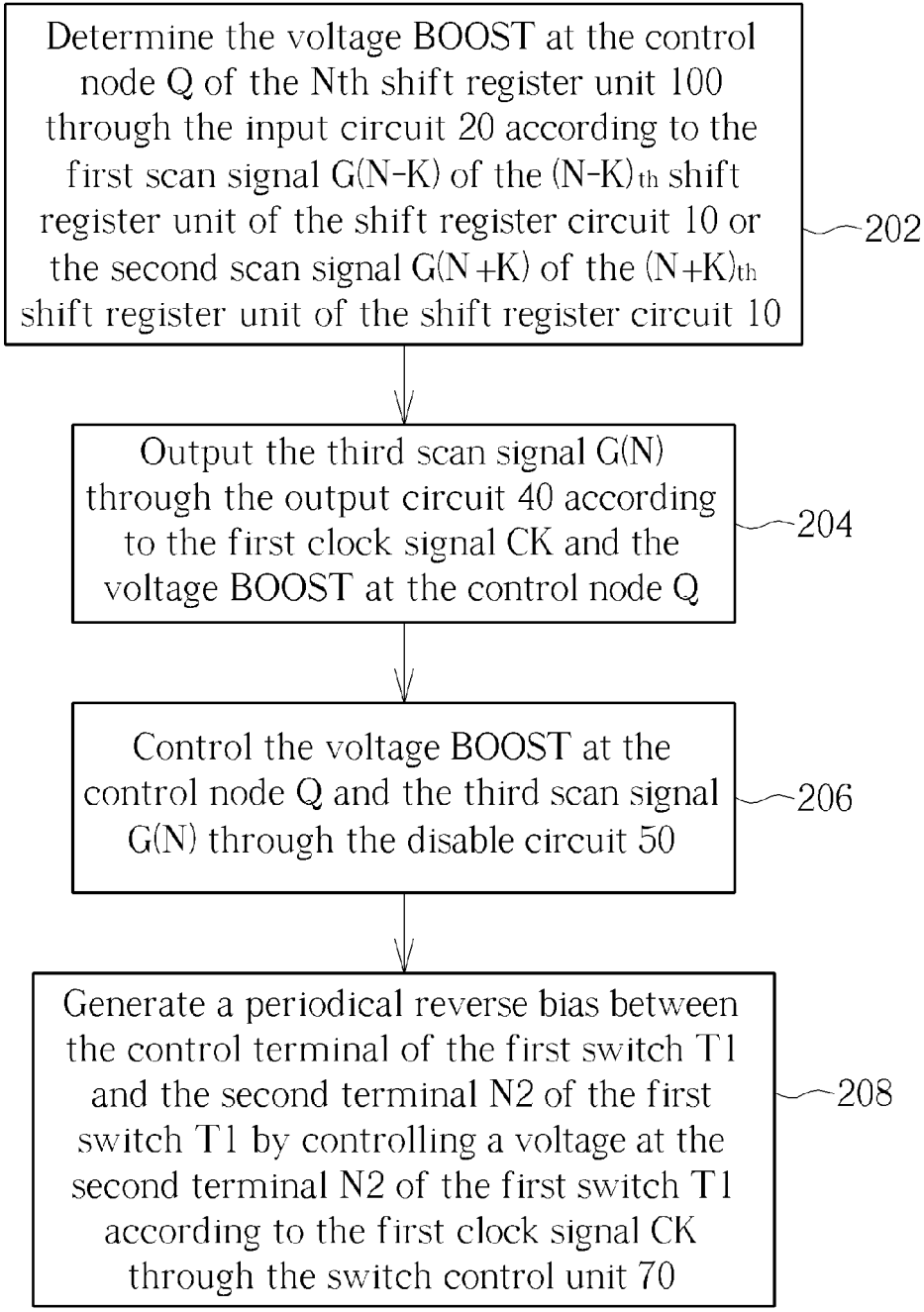
FIG. 3 shows a method for operating the $N_{th}$ shift register unit in FIG. 2.

Pl refer to FIG. 3 with FIG. 2. FIG. 3 shows a method for operating the $N_{th}$ shift register 100 in FIG. 2. The method comprises the following steps:

Step 202: Control the voltage BOOST at the control node Q of the $N_{th}$ shift register unit 100 through the input circuit 20 according to the first scan signal G(N−K) of the $(N-K)_{th}$ shift register unit of the shift register circuit 10 or the second scan signal G(N+K) of the $(N+K)_{th}$ shift register unit of the shift register circuit 10;

Step 204: Output the third scan signal G(N) of the $N_{th}$ shift register 100 through the output circuit 40 according to the first clock signal CK and the voltage BOOST at the control node Q of the $N_{th}$ shift register unit 100;

Step 206: Control the voltage BOOST at the control node Q of the $N_{th}$ shift register unit 100 and the third scan signal G(N) of the $N_{th}$ shift register 100 through the disable circuit 50;

Step 208: Generate a periodical reverse bias between the control terminal of the first switch T1 and the second terminal N2 of the first switch T1 by controlling a voltage at the second terminal N2 of the first switch T1 according to the first clock signal CK through the switch control unit 70.

In step 202, the voltage BOOST at the control node Q of the Nth shift register unit 100 can be controlled according to the first logic signal Bi, the second logic signal XBi, the first scan signal G(N−K) and the second scan signal G(N+K). In step 204, the third scan signal G(N) is configured to output to an input circuit of a next shift register unit 100.

In step 206, the voltage BOOST at the control node Q of the $N_{th}$ shift register unit 100 and the third scan signal G(N) of the $N_{th}$ shift register 100 can be pulled down according to a voltage at the second terminal N1 of the first coupling element 32 and the second clock signal XCK. In step 208, the second terminal N2 of the first switch T1 and the ground terminal VSS can be electrically disconnected by controlling the voltage level at the second terminal N2 of the first switch T1 according to the first clock signal CK to generate the periodical reverse bias between the control terminal of the first switch T1 and the second terminal N2 of the first switch T1.

Figure 4:
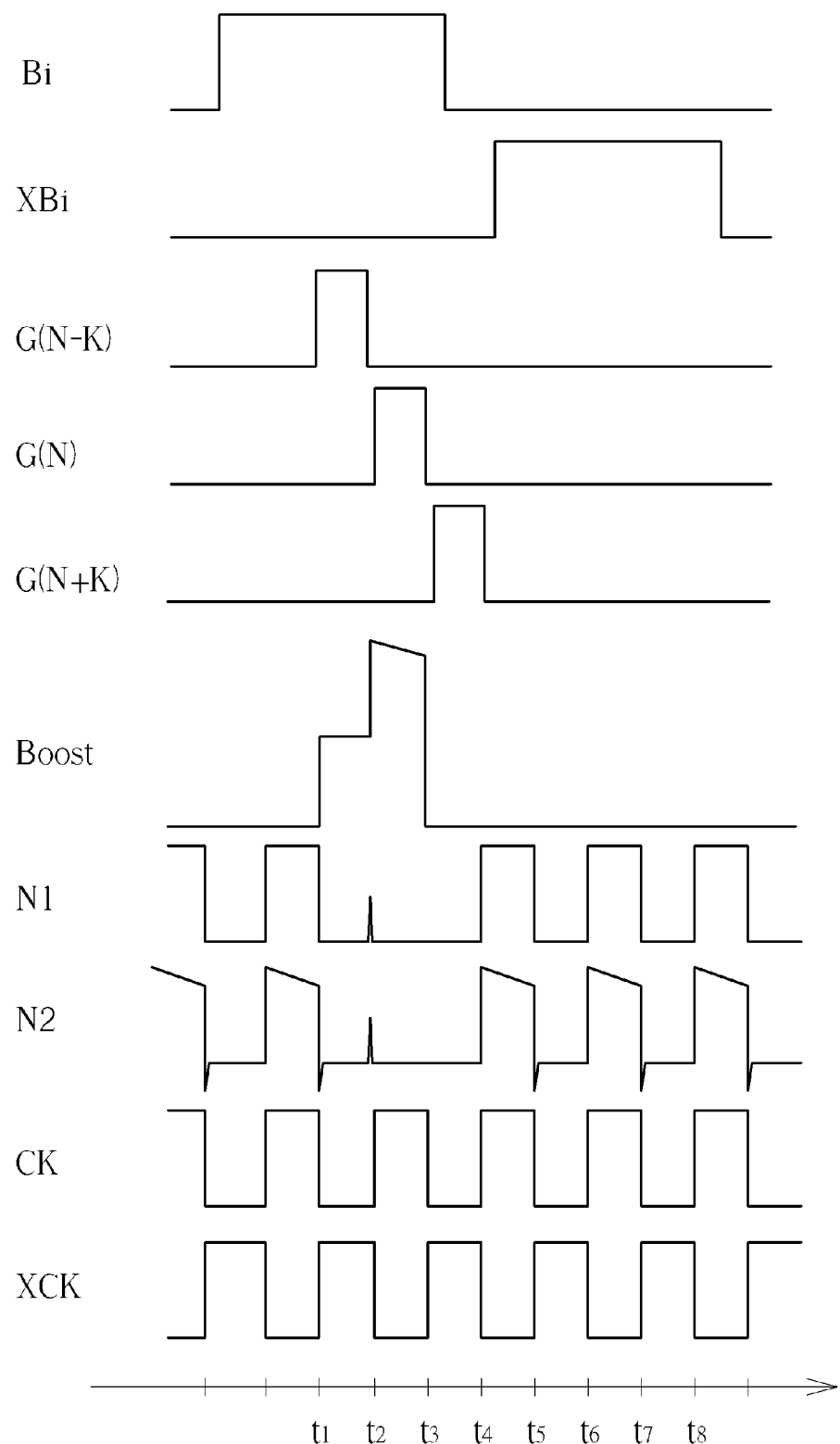
FIG. 4 shows a time diagram for operating the $N_{th}$ shift register unit in FIG. 2.

Pl refer to FIG. 4. FIG. 4 shows a timing diagram for operating the $N_{th}$ shift register unit 100 in FIG. 2. In FIG. 4, the waveforms of the first logic signal Bi, the second logic signal XBi, the first scan signal G(N−K), the third scan signal G(N), the second scan signal G(N+K), the voltage BOOST at the control node Q of the $N_{th}$ shift register unit 100, the second terminal N1 of the first coupling element 32, the second terminal N2 of the first switch T1, the first clock signal CK and the second clock signal XCK are shown from top to bottom in FIG. 4. In the interval between t1 and t2, the second scan signal G(N+K) is at the low level so that the fourth switch T4 is turned off, and the first scan signal G(N−K) is at a high level so that the third switch T3 is turned on. Hence, the voltage BOOST at the node Q of the $N_{th}$ shift register unit 100 is configured to be at the high level by being charged by the first logical signal Bi, which turns on the eighth switch T8, the first switch T1 and the second switch T2.

Since the first switch T1 and the second switch T2 are turned on, the node N1 and the node N2 are at the low level by being coupled to the ground terminal VSS. This prevents the fifth switch T5 and the sixth switch T6 from being turned on. Besides, because the second clock signal XCK is at the high level in the interval between t1 and t2, the seventh switch T7 is turned on so that third scan signal G(N) is at the low level by being coupled to the ground terminal VSS. Further, since the eighth switch T8 is turned on by the voltage BOOST, the third scan signal G(N) is at the low level due to the low level of the first clock signal CK. The mentioned node N1 is the second terminal N1 of the first coupling element 32, and the mentioned node N2 is the second terminal N2 of the first switch T1.

In the interval between t2 and t3, the third switch T3 is turned off because the first scan signal G(N−K) is at the low level, and the fourth switch T4 is still kept off because the second scan signal G(N+K) is still at the low level. Because the first clock signal CK at the first terminal of the eighth switch T8 is at the high level, the voltage BOOST at the node Q of the $N_{th}$ shift register unit 100 is further pulled up to a higher level due to the coupling effect of a parasitic capacitor formed between the first terminal of the eighth switch T8 and the control terminal of the eighth switch T8. This keeps turning on the eighth switch T8 and pulls up the third scan signal G(N) to the high level.

Because the first clock signal CK rises to the high level from the low level at t2, the capacitance effect across the first coupling element 32 will drive up the voltage at the node N1, and the capacitance effect across the second coupling element 72 will drive up the voltage at the node N2. However, the voltage BOOST at the node Q of the $N_{th}$ shift register unit 100 is pulled higher than the high level, the first switch T1 and the second switch T2 continue to be turned on, hence the node N1 and the node N2 are pulled down by the ground terminal VSS to the low level immediately after being driven up by the first clock signal CK. In the interval between t2 and t3, the fifth switch T5 and the sixth switch T6 are being kept off, and the seventh switch T7 is turned off because the second clock signal XCK changes to the low level.

In the interval between t3 and t4, the first scan signal G(N−K) is at the low level so that the third switch T3 is kept off. The second scan signal G(N+K) is set to be at the high level so that the fourth switch T4 is turned on. Because the second logic signal XBi is still at the low level, the voltage BOOST at the control node Q of the $N_{th}$ shift register unit 100 is pulled down to the low level, and the first switch T1, the second switch T2 and the eighth switch T8 are turned off accordingly. Because the node N1 and the node N2 are at the low level in the interval between t2 and t3, and the first clock signal CK falls to the low level in the interval between t3 and t4, the node N1 and the node N2 are kept at the low level in the interval between t3 and t4, and hence the fifth switch T5 and the sixth switch T6 are kept off. The seventh switch T7 is turned on because the second clock signal XCK is at the high level, and the third scan signal G(N) is pulled down to the low level by the ground terminal VSS.

In the interval between t4 and t5, the third switch T3 is kept off because the first scan signal G(N−K) is kept at the low level, and the fourth switch T4 is turned off because the second scan signal G (N+K) falls to the low level. Because the first clock signal CK rises from the low level to the high level at t4, the capacitance effect across the first coupling element 32 pulls up the node N1 to the high level, and the capacitance effect across the second coupling element 72 pulls up the node N2 to the high level. Although the voltage level at the node N2 drops slightly in the interval between t4 and t5 due to current leakage through the second switch T2, the voltage at the node N2 is still higher than the voltage at the control terminal of the first switch T1 in the interval between t4 and t5. Hence, a reverse bias is generated between the control terminal and the second terminal of the first switch T1, preventing current leakage through the first switch T1. The node N1 can thus be kept at the consistent high level and firmly turn on the fifth switch T5 and the sixth switch T6, keeping the voltage BOOST at the control node Q of the $N_{th}$ shift register unit 100 and the third scan signal G(N) at the low level. If the first switch T1 is an N-type MOSFET (metal oxide semiconductor field effect transistor), since its gate voltage is lower than its source voltage, the first switch T1 has a reverse bias to prevent leakage current effectively.

In the interval between t5 and t6, the third switch T3 is kept off because the first scan signal G(N−K) is still at the low level, and the fourth switch T4 is kept off because the second scan signal G(N+K) is still at the low level. Because the voltage BOOST at the control node Q of the $N_{th}$ shift register unit 100 is at low level in the interval between t4 and t5, the voltage BOOST at the control node Q of the $N_{th}$ shift register unit 100 is kept at the low level in the interval between t5 and t6, keeping the first switch T1, the second switch T2 and the eighth switch T8 are turned off. Because the first clock signal CK drops to the low level from the high level at t5, the capacitance effect across the first coupling element 32 pulls down the node N1 to the low level from the high level, and the capacitance effect across the second coupling element 72 also pulls down the node N2. The fifth switch T5 and the sixth switch T6 are therefore turned off. Because the second clock signal XCK is at the high level in the interval between t5 and t6, the seventh switch T7 is turned on so that the third scan signal G(N) is kept at the low level by the ground terminal VSS.

Besides, the waveforms in the interval between t6 and t7 are the same as the waveforms in the interval between t4 and t5, and the waveforms in the interval between t7 and t8 are the same as the waveforms in the interval between t5 and t6, therefore operation of the $N_{th}$ shift register unit 100 in the interval between t6 and t8 will not be described again hereinafter. From the waveform of the voltage at the node N1, it can be seen that the voltage at the node N1 behaves like a square wave and is very stable in the interval between t4 and t5 and in the interval between t6 and t7. Hence, occurrence of multi-pulse is reduced or eliminated. in the shift register circuit 10. When the shift register circuit 10 is applied in a liquid crystal display (LCD), undesirable horizontal lines are prevented from being displayed on the LCD so that the display quality is improved.

Figure 5:
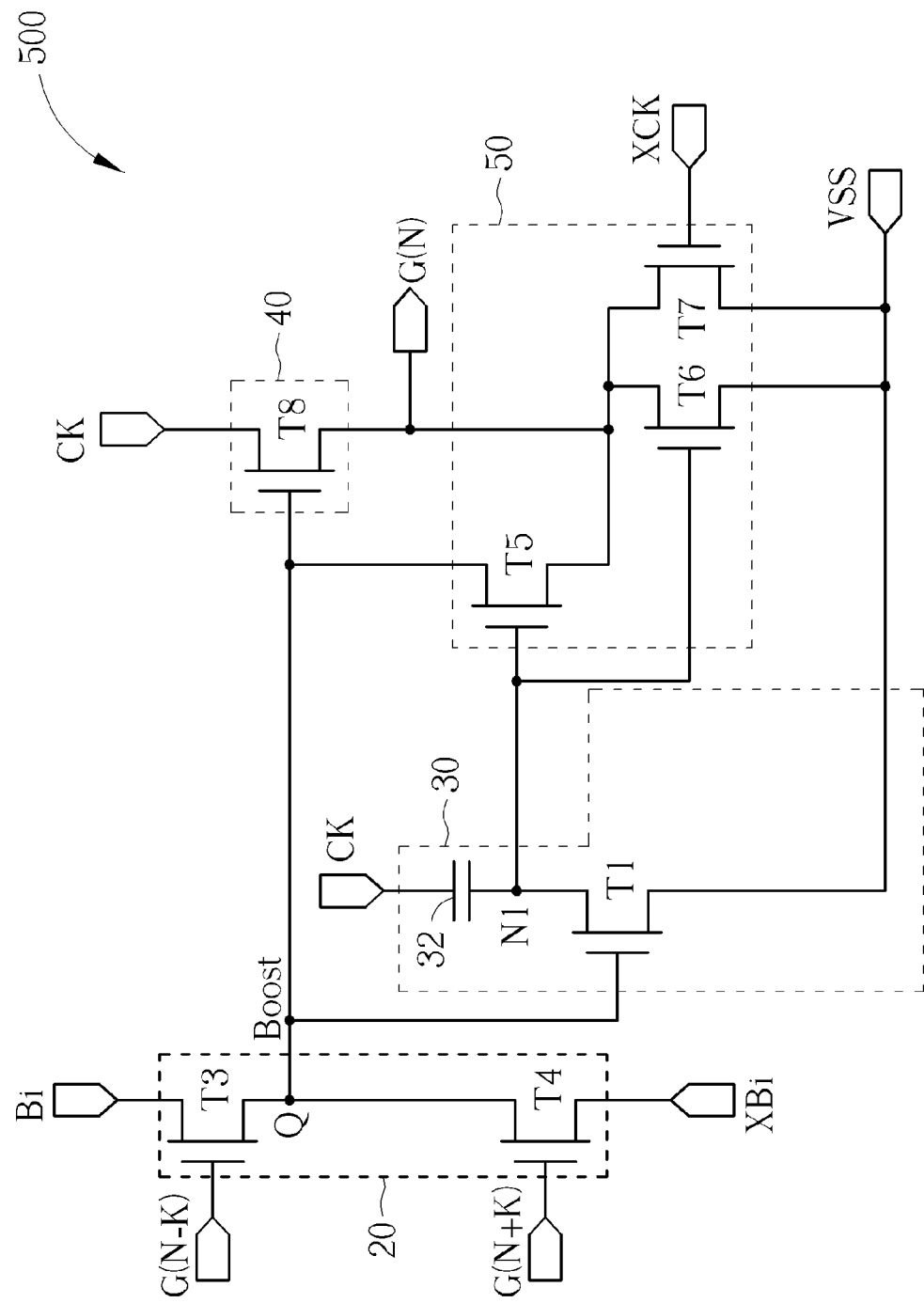
FIG. 5 shows an $N_{th}$ shift register unit of a shift register circuit according to a second embodiment of the present invention.

Please refer to FIG. 5. FIG. 5 shows an $N_{th}$ shift register unit 500 according to the second embodiment of the present invention. The difference from the $N_{th}$ shift register unit 500 and the $N_{th}$ shift register unit 100 is that the $N_{th}$ shift register unit 500 does not comprise the switch control unit 70, and the second terminal of the first switch T1 is directly coupled to the ground terminal VSS. Hence, in the $N_{th}$ shift register unit 500 shown in FIG. 5, the node N1 would have current leakage to the ground terminal VSS through the first switch T1. Comparing with the $N_{th}$ shift register unit 500 in FIG. 5, the $N_{th}$ shift register unit 100 in FIG. 2 can significantly reduce the current leakage through the first switch T1 with the switch control unit 70. The switch control unit 70 can generate a reverse bias between the control terminal and the second terminal of the first switch T1 when the node N2 is at the high level and the voltage BOOST at the control node Q of the $N_{th}$ shift register unit 100 is at the low level.

In conclusion, the shift register unit 100 of the present invention can generate a reverse bias on the first switch T1 by configuring the switch control unit 70 so as to significantly reduce current leakage through the first switch T1, hence display quality can be improved by adopting the shift register unit 100 in a liquid crystal display.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shift register circuit comprising a plurality of shift register units, an $N_{th}$ shift register unit of the shift register circuit comprising:
    an input circuit configured to control a voltage at a control node of the $N_{th}$ shift register unit according to a first scan signal of an $(N-K)_{th}$ shift register unit of the shift register circuit or a second scan signal of an $(N+K)_{th}$ shift register unit of the shift register circuit wherein N and K are positive integers, and N≥K;
    a voltage regulator comprising:
        a first coupling element comprising a first terminal and a second terminal, the first terminal being configured to receive a first clock signal;
        a first switch comprising a first terminal electrically coupled to the second terminal of the first coupling element, a control terminal electrically coupled to the input circuit and configured to receive the voltage at the control node of the $N_{th}$ shift register unit, and a second terminal; and
        a switch control unit electrically coupled to the second terminal of the first switch and a ground terminal and configured to control a voltage at the second terminal of the first switch according to the first clock signal and to generate a periodical reverse bias between the control terminal of the first switch and the second terminal of the first switch; and
    an output circuit comprising a first terminal configured to receive the first clock signal, a control terminal electrically coupled to the input circuit to receive the voltage at the control node of the $N_{th}$ shift register unit, and a second terminal configured to output a third scan signal of the $N_{th}$ shift register unit.

2. The shift register circuit of claim 1 wherein the switch control unit comprises:
    a second switch comprising a first terminal electrically coupled to the second terminal of the first switch, a control terminal electrically coupled to the input circuit and configured to receive the voltage at the control node of the $N_{th}$ shift register unit, and a second terminal electrically coupled to the ground terminal; and
    a second coupling element comprising a first terminal electrically coupled to the second terminal of the first switch and a second terminal configured to receive the first clock signal.

3. The shift register circuit of claim 2 wherein the input circuit is further configured to receive a first logic signal, a second logic signal, the first scan signal and the second scan signal, and determine which of the first logic signal and the second logic signal is to be used to control the voltage at the control node of the $N_{th}$ shift register unit according to the first scan signal and the second scan signal.

4. The shift register circuit of claim 3 wherein the input circuit comprises:
    a third switch comprising:
        a first terminal configured to receive the first logic signal;
        a control terminal configured to receive the first scan signal; and
        a second terminal electrically coupled to the control terminal of the first switch; and
    a fourth switch comprising:
        a first terminal electrically coupled to the second terminal of the third switch;
        a control terminal configured to receive the second scan signal; and
        a second terminal configured to receive the second logic signal.

5. The shift register circuit of claim 4 wherein the shift register circuit further comprises a disable circuit electrically coupled to the input circuit and the second terminal of the first coupling element and configured to receive a second clock signal and to control the voltage at the control node of the $N_{th}$ shift register unit and a voltage of the third scan signal according to a voltage at the second terminal of the first coupling element and the second clock signal, the disable circuit comprising:
    a fifth switch comprising a first terminal electrically coupled to the control node of the $N_{th}$ shift register unit, a control terminal electrically coupled to the second terminal of the first coupling element, and a second terminal electrically coupled to the second terminal of the output circuit;
    a sixth switch comprising a first terminal electrically coupled to the second terminal of the fifth switch, a control terminal electrically coupled to the second terminal of the first coupling element, and a second terminal electrically coupled to the ground terminal; and
    a seventh switch comprising a first terminal electrically coupled to the second terminal of the fifth switch, a control terminal configured to receive the second clock signal, and a second terminal electrically coupled to the ground terminal.

6. The shift register circuit of claim 5 wherein the output circuit comprises an eighth switch comprising a first terminal configured to receive the first clock signal, a control terminal electrically coupled to the input circuit and configured to receive the voltage at the control node of the $N_{th}$ shift register unit, and a second terminal configured to output the third scan signal of the $N_{th}$ shift register unit.

7. The shift register circuit of claim 1 wherein the input circuit is further configured to receive a first logic signal, a second logic signal, the first scan signal and the second scan signal, and determine which of the first logic signal and the second logic signal is to be used to control the voltage at the control node of the $N_{th}$ shift register unit according to the first scan signal and the second scan signal.

8. The shift register circuit of claim 7 wherein the input circuit comprises:
    a third switch comprising:
        a first terminal configured to receive the first logic signal;
        a control terminal configured to receive the first scan signal; and
        a second terminal electrically coupled to the control terminal of the first switch; and a fourth switch comprising:
  a first terminal electrically coupled to the second terminal of the third switch;
  a control terminal configured to receive the second scan signal; and
  a second terminal configured to receive the second logic signal.

9. The shift register circuit of claim 8 wherein the shift register circuit further comprises a disable circuit electrically coupled to the input circuit and the second terminal of the first coupling element and configured to receive a second clock signal and to control the voltage at the control node of the $N_{th}$ shift register unit and a voltage of the third scan signal according to a voltage at the second terminal of the first coupling element and the second clock signal, the disable circuit comprising:
  a fifth switch comprising a first terminal electrically coupled to the control node of the $N_{th}$ shift register unit, a control terminal electrically coupled to the second terminal of the first coupling element, and a second terminal electrically coupled to the second terminal of the output circuit;
  a sixth switch comprising a first terminal electrically coupled to the second terminal of the fifth switch, a control terminal electrically coupled to the second terminal of the first coupling element, and a second terminal electrically coupled to the ground terminal; and
  a seventh switch comprising a first terminal electrically coupled to the second terminal of the fifth switch, a control terminal configured to receive the second clock signal, and a second terminal electrically coupled to the ground terminal.

10. The shift register circuit of claim 9 wherein the output circuit comprises an eighth switch comprising a first terminal configured to receive the first clock signal, a control terminal electrically coupled to the input circuit and configured to receive the voltage at the control node of the $N_{th}$ shift register unit, and a second terminal configured to output the third scan signal of the $N_{th}$ shift register unit.

11. The shift register circuit of claim 1 wherein a voltage level of the second terminal of the first switch is higher than a voltage level of the control terminal of the first switch when a reverse bias is generated between the control terminal of the first switch and the second terminal of the first switch.

12. The shift register circuit of claim 1 wherein the first coupling element is a capacitor.

13. A method for operating the $N_{th}$ shift register unit of claim 1, comprising:
  controlling the voltage at the control node of the $N_{th}$ shift register unit according to the first scan signal of the $(N-K)_{th}$ shift register unit or the second scan signal of the $(N+K)_{th}$ shift register unit;
  receiving the first clock signal and the voltage at the control node of the $N_{th}$ shift register unit through the output circuit and outputting the third scan signal according to the first clock signal and the voltage at the control node of the $N_{th}$ shift register unit; and
  controlling the voltage at the second terminal of the first switch according to the first clock signal through a switch control unit and generating the periodical reverse bias between the control terminal of the first switch and the second terminal of the first switch.

14. The method of claim 13 wherein controlling the voltage at the control node of the $N_{th}$ shift register unit according to the first scan signal of the $(N-K)_{th}$ shift register unit or the second scan signal of the $(N+K)_{th}$ shift register unit comprises determining which of a first logic signal and a second logic signal is to be used to control the voltage at the control node of the $N_{th}$ shift register unit according to the first scan signal and the second scan signal.

15. The method of claim 14 wherein controlling the voltage at the second terminal of the first switch according to the first clock signal through the switch control unit and generating the periodical reverse bias between the control terminal and the second terminal of the first switch includes:
  controlling the voltage at the second terminal of the first switch according to the first clock signal received by a second coupling element of the switch control unit; and
  decoupling the second terminal of the first switch from a ground terminal through a second switch of the switch control unit.

16. The method of claim 14 further comprising controlling the voltage at the control node of the $N_{th}$ shift register unit and a voltage of the third scan signal through a disable circuit.

17. The method of claim 16 wherein controlling the voltage at the control node of the $N_{th}$ shift register unit and the voltage of the third scan signal through the disable circuit comprises pulling down the voltage at the control node of the $N_{th}$ shift register unit and the voltage of the third scan signal according to a second clock signal and a voltage at the second terminal of the first coupling element.

18. The method of claim 17 wherein controlling the voltage at the second terminal of the first switch according to the first clock signal through the switch control unit and generating the periodical reverse bias between the control terminal and the second terminal of the first switch includes:
  controlling the voltage at the second terminal of the first switch according to the first clock signal received by a second coupling element of the switch control unit; and
  decoupling the second terminal of the first switch from the ground terminal through a second switch of the switch control unit.

19. The method of claim 16 wherein controlling the voltage at the second terminal of the first switch according to the first clock signal through the switch control unit and generating the periodical reverse bias between the control terminal and the second terminal of the first switch includes:
  controlling the voltage at the second terminal of the first switch according to the first clock signal received by a second coupling element of the switch control unit; and
  decoupling the second terminal of the first switch from the ground terminal through a second switch of the switch control unit.

20. The method of claim 13 wherein controlling the voltage at the second terminal of the first switch according to the first clock signal through the switch control unit and generating the periodical reverse bias between the control terminal and the second terminal of the first switch includes:
  controlling the voltage at the second terminal of the first switch according to the first clock signal received by a second coupling element of the switch control unit; and
  decoupling the second terminal of the first switch from the ground terminal through a second switch of the switch control unit.

* * * * *